(12) United States Patent
Chen et al.

(10) Patent No.: US 7,482,265 B2
(45) Date of Patent: Jan. 27, 2009

(54) UV CURING OF LOW-K POROUS DIELECTRICS

(75) Inventors: I-I Chen, Taipei (TW); Tien-I Bao, Hsin-Chu (TW); Shwang-Ming Cheug, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 391 days.

(21) Appl. No.: 11/328,596

(22) Filed: Jan. 10, 2006

(65) Prior Publication Data

US 2007/0161230 A1    Jul. 12, 2007

(51) Int. Cl.
*H01L 21/469* (2006.01)

(52) U.S. Cl. .................. 438/637; 438/781; 438/788; 438/790; 257/E21.581; 427/515

(58) Field of Classification Search ................. 438/619
See application file for complete search history.

(56) References Cited

U.S. PATENT DOCUMENTS

| 6,319,809 | B1 | 11/2001 | Chang et al. |
| 6,383,913 | B1 | 5/2002 | Tsai et al. |
| 6,528,409 | B1 | 3/2003 | Lopatin et al. |
| 6,737,365 | B1 | 5/2004 | Kloster et al. |
| 6,740,685 | B2 | 5/2004 | Li et al. |
| 6,756,085 | B2 | 6/2004 | Waldfried et al. |
| 6,825,529 | B2 | 11/2004 | Chidambarrao et al. |
| 7,265,061 | B1 * | 9/2007 | Cho et al. ............ 438/764 |
| 2003/0181018 | A1 | 9/2003 | Geusic et al. |
| 2003/0218253 | A1 | 11/2003 | Avanzino et al. |
| 2004/0058090 | A1 | 3/2004 | Waldfried et al. |
| 2004/0058523 | A1 | 3/2004 | Li et al. |
| 2004/0130027 | A1 | 7/2004 | Chen et al. |
| 2004/0130032 | A1 | 7/2004 | Gronbeck et al. |
| 2004/0137728 | A1 | 7/2004 | Gallagher et al. |
| 2004/0175958 | A1 | 9/2004 | Lin et al. |
| 2005/0048795 | A1 | 3/2005 | Ko et al. |
| 2006/0024976 | A1 * | 2/2006 | Waldfried et al. ........... 438/778 |
| 2007/0105401 | A1 * | 5/2007 | Liu et al. .................... 438/795 |

OTHER PUBLICATIONS

Fayolle, M., et al., "Cu/ULK integration using a post integration porogen removal approach", Interconnect Technology Conference, Jun. 7-9, 2004, IEEE, pp. 208-210.

(Continued)

*Primary Examiner*—Stephen W Smoot
(74) *Attorney, Agent, or Firm*—Slater & Matsil, L.L.P.

(57) ABSTRACT

A method of manufacturing a semiconductor device having a low-k dielectric layer is provided. An embodiment comprises forming a dielectric layer on a substrate, wherein the layer comprises a pore generating material dispersed in an uncured matrix. A second step comprises forming pores in the uncured matrix by irradiating the layer with radiation having a first wavelength. After pore forming, a third step comprises cross-linking the dielectric by irradiating it at a second wavelength, the second being less than the first. In an embodiment, the irradiating wavelengths comprise ultra-violet radiation. Embodiments may further include repairing processing damage wherein the damage includes dangling bonds or silanol formation. The repairing includes annealing in a carbon-containing ambient such as $C_2H_4$, $C_3H_6$, or hexamethyldisilazane (HMDS).

19 Claims, 5 Drawing Sheets

OTHER PUBLICATIONS

Hedden, R. C., et al., "Comparison of Curing Processes for Porous Dielectrics: Measurements from Specular X-Ray Reflectivity", Journal of The Electrochemical Society, 2004, pp. F178-F181, vol. 151, No. 8.

Kohl, A. T., et al., "Low $k$, Porous Methyl Silsesquioxane and Spin-On-Glass", Electrochemical and Solid-State Letters, 1999, pp. 77-79, vol. 2, No. 2.

* cited by examiner

UV CURING OF LOW-K POROUS DIELECTRICS

TECHNICAL FIELD

This invention relates generally to semiconductor device fabrication and more particularly to a method for forming porous, low-k dielectric layers.

BACKGROUND

As the density of semiconductor devices increases and the size of circuit elements becomes smaller, the resistance capacitance (RC) delay time increasingly dominates the circuit performance. To reduce the RC delay, there is a desire to switch from conventional dielectrics to low-k dielectrics. These materials are particularly useful as intermetal dielectrics, IMDs, and as interlayer dielectrics, ILDs. However, low-k materials present problems during processing, especially during the processing of the conductive material used to make interconnects.

The conductive material is typically patterned and etched using high-energy plasma etch processes. In other process schemes, the low-k material is patterned through the application and patterning of photoresist. The low-k material is etched through the photoresist mask, and then the photoresist is removed with a high energy plasma etch process. The low-k materials are susceptible to damage from a plasma etch because they are softer, less chemically stable, or any combination of these factors. The plasma damage can manifest itself in higher leakage currents, lower breakdown voltages, and changes in the dielectric constant associated with the low-k dielectric material.

One example of low-k dielectrics are porous dielectric materials. The porous low-k dielectric is typically formed from a low-k precursor material comprised of a thermally cured matrix material and a thermally degradable porogen material. Typically, a spin-on process applies a solution of the uncured, low-k, precursor material, and then a thermal process cures the low-k precursor material to form the low-k dielectric material. The curing process, which may include one or more processing steps, typically cross links the matrix and forms pores by thermally degrading the porogen. During curing, the porogen forms volatile by-products that diffuse out of the low-k dielectric material leaving nanopores in their place.

Waldfried et al. in U.S. Pat. No. 6,756,085 disclose that ultraviolet (UV) curing decreases the curing time, increases the elastic modulus, and increases hardness of dielectric materials. Waldfried et al., in U.S. Patent Application Publication No. 2004/0058090, disclose that the benefits of UV curing extend to porous dielectric materials.

Despite recent advances, however, integration of porous dielectrics into conventional device fabrication schemes has created new problems. The open and interconnected porosity of the dielectrics allow reactive gases and chemicals to easily penetrate into the porous structure and damage the bulk material. Particularly degrading processes are photoresist removal and metal deposition. Moreover, the introduction of nanopores often deteriorates the mechanical properties of the film thereby limiting the yield of chemical mechanical polishing in copper-ELK (extreme low-k dielectric) process integration.

To overcome these and other problems, new and improved manufacturing methods are needed in order to realize the full advantages of porous, low-k dielectrics.

SUMMARY OF THE INVENTION

These and other problems are generally solved or circumvented, and technical advantages are generally achieved, by preferred embodiments of the present invention comprising a method for formation of a porous, low-k dielectric.

A method of manufacturing a semiconductor device having a low-k dielectric layer is provided. A preferred embodiment comprises the steps forming a layer on a substrate, wherein the layer comprises a pore generating material dispersed in an uncured matrix. A second step comprises forming pores in the uncured matrix by irradiating the layer with radiation having a first wavelength. A third step comprises irradiating layer with radiation having a second wavelength. Preferably, the third step cross-links the layer. The irradiating wavelengths preferably comprise ultra-violet radiation. The step of pore generation preferably precedes the cross-linking step.

Other embodiments of the invention provide a method of repairing damage in carbon-containing, low-k dielectrics. The damage may include processing damage such as dangling bonds or silanol formation. The repairing preferably includes generating pores in an uncured matrix and annealing in a carbon-containing ambient such as $C_2H_4$, $C_3H_6$, super-critical $CO_2$, or hexamethyldisilazane (HMDS).

Still other embodiments of the invention provide a method of fabricating a damascene interconnect structure in a low-k dielectric. Embodiments preferably forming a low-k dielectric layer, wherein the low-k dielectric comprises a pore-generating material, and fabricating a damascene interconnect structure in the low-k dielectric. Embodiments further include irradiating the low-k dielectric and generating pores therein using a first UV wavelength radiation after fabricating the damascene interconnect structure. The low-k dielectric is cross-linked using a second UV wavelength radiation after generating pores. Preferably, the second wavelength is less than the first wavelength.

Additional features and advantages of embodiments of the invention will be described hereinafter, which form the subject of the claims of the invention. It should be appreciated by those skilled in the art that the specific embodiments disclosed might be readily utilized as a basis for modifying or designing other structures or processes for carrying out the purposes of the present invention. It should also be realized by those skilled in the art that such equivalent constructions and variations on the example embodiments described do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The operation and fabrication of the presently preferred embodiments are discussed in detail below. However, the embodiments and examples described herein are not the only applications or uses contemplated for the invention. The specific embodiments discussed are merely illustrative of specific ways to make and use the invention, and do not limit the scope of the invention or the appended claims.

Figure 1:
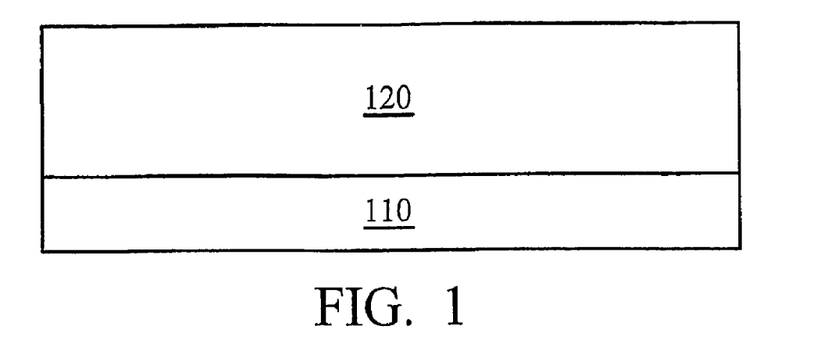
FIG. 1 is a cross sectional view showing the forming of a low-k dielectric layer on a substrate according to embodiments of the invention.

This invention relates generally to semiconductor device fabrication and more specifically to porous, low-k dielectric formation by degradation of a porogen. Referring now to FIG. 1, there is shown a typical substrate 110 used in the manufacture of semiconductor devices. The substrate 110 may comprise bulk silicon, doped or undoped, or an active layer of a silicon on insulator (SOI) substrate. Generally, an SOI substrate comprises a layer of a semiconductor material such as silicon, germanium, silicon germanium, silicon on insulator (SOI), silicon germanium on insulator (SGOI), or combinations thereof. The insulator layer may be, for example, a buried oxide (BOX) layer or a silicon oxide layer. The insulator layer is provided on a substrate, typically a silicon or glass substrate. Other substrates that may be used include multi-layered substrates, gradient substrates, or hybrid orientation substrates. In the preferred embodiment illustrated in FIG. 1, the substrate 110 is comprised of single crystal silicon having a <100> crystallographic orientation.

According to preferred embodiments of the present invention, a low-k dielectric material 120 is deposited on a top surface of the substrate 110 by a CVD (chemical vapor deposition) process or a spin-on process. The term low-k as used herein preferably includes materials having a dielectric constant less than about 3 and more preferably between 1.9 and 2.5.

Suitable examples of commercial low-k dielectrics include Dow Chemical Company's porous SILK product and JSR Corporation's JSR 5109. Others examples include Shipley Company's commercially available ZIRKON™ LK ILD, which is a blend of a methylsilsesquioxane (MSQ) based material with acrylic, polymer-based, nano-particle porogen dispersed in a solvent (PGMEA). The dielectric constant of LK, after porogen removal, has been reported in the art as being 2.5.

ZIRKON™ LK ILD may be deposited using a conventional spin coater. Degradation of the ZIRKON™ LK ILD porogen begins at about 275° C., and complete degradation, or curing, occurs at about 450° C. Therefore, process integration steps (photolithography, etching, resist removal, metallization, CMP, and post-CMP cap layer deposition), may include maintaining temperatures less than about 275° C.

In preferred embodiments the porous dielectric material may include organic materials, inorganic materials, or combinations thereof. More preferably, the dielectric material may include, hydrogen silsesquioxane (HSQ) dielectric materials, methylsilsesquioxane (MSQ) dielectric materials, and combinations thereof. Preferred deposition methods include a plasma enhanced chemical vapor deposition (PECVD) process. Suitable PECVD process conditions include a temperature of about 225° C., a pressure of about 225 torr, and about 600 W power.

As will be appreciated by those skilled in the art, damage to porous dielectrics during processing is an important problem. Such damage causes processing chemicals to enter the pores, thereby raising the dielectric constant well above preferred levels. It is therefore desirable to have a low-k dielectric material having increased hardness which is generally associated with increased mechanical toughness. A plasma treatment or an e-beam treatment could improve hardness and modules. Alternatively, or in addition, and most preferably, a UV (ultraviolet) treatment is used.

Figure 2A:
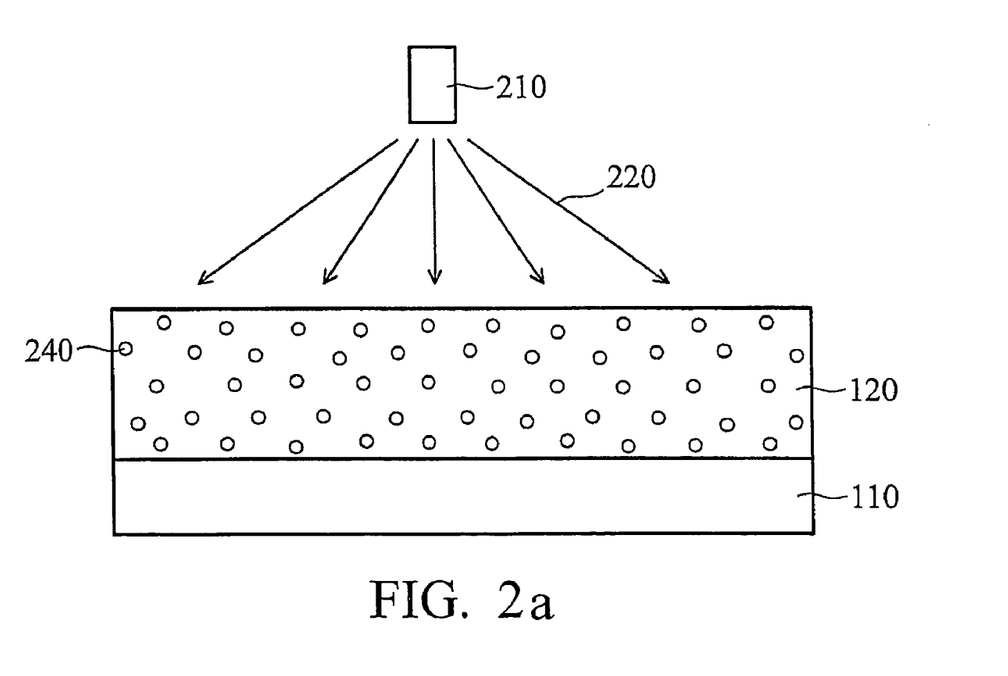
FIGS. 2a and 2b are cross-sectional views showing UV dielectric curing according to preferred embodiments.

Therefore, turning now to FIG. 2a, there is shown the structure of FIG. 1 after treating according to preferred embodiments. Embodiments include a first UV treatment using a UV source 210 to irradiate the dielectric layer 120 with UV radiation 220. The UV source 210 may include a broad beam (BB) UV source. Embodiments may further include using a monochronomator, diffraction grating, or, preferably, a filter to selectively remove undesired wavelengths from the UV radiation 220.

The first UV treatment preferably decomposes the porogen from within in the low-k dielectric 120, thereby forming pores 240. The UV radiation for the first treatment is preferably about 280 nm. Pore generation preferably occurs at about 350° C. Most of the porogen is degraded and the pores suitably formed after about 90 seconds. After pore generation, the dielectric constant may be below the preferred 2.5 value, but the dielectric generally lacks the required hardness. At this stage of processing, the hardness is typically below about 1.0 GPa.

Figure 2B:
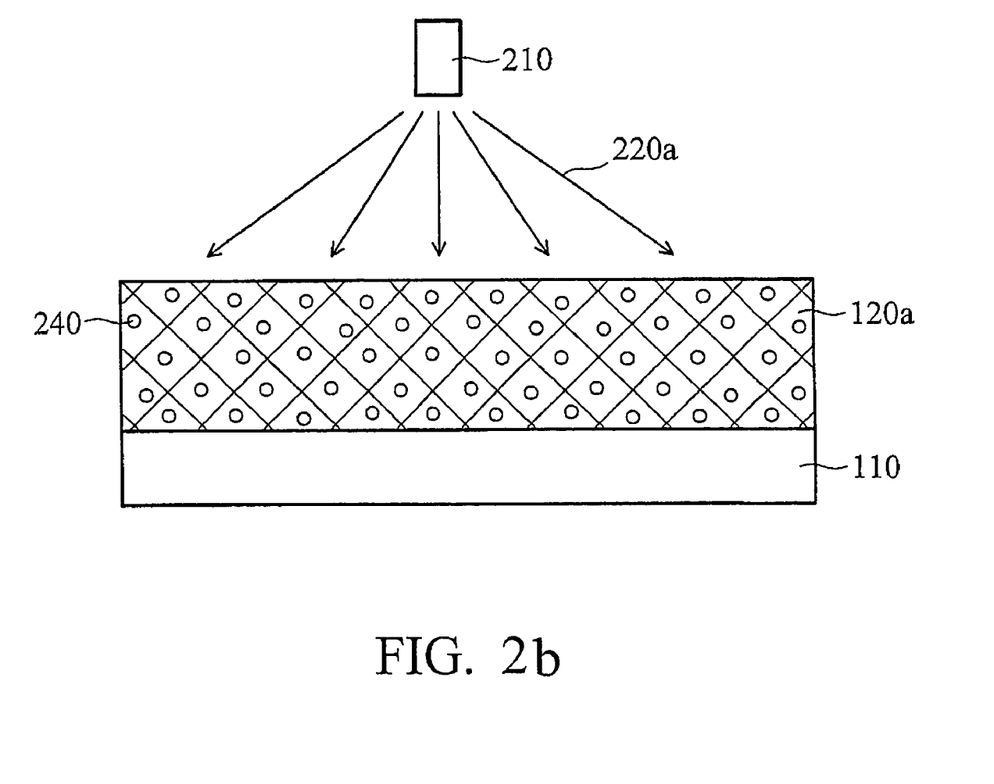

Embodiments of the invention preferably further include at least one additional UV treatment as illustrated in FIG. 2b. Preferably, a second UV wavelength 220a forms a cross linked dielectric 120a. Forming the cross-linked dielectric 120a includes converting Si—O—Si bonding from a cage-like structure to a network structure. In preferred embodiments, the second UV wavelength 220a is less than the first UV wavelength 220. Preferably, the second UV wavelength is less than about 250 nm. Cross-linking preferably occurs at about 350° C. for about 60 seconds. Such cross-linking typically hardens the dielectric and preferably increases its hardness up to about 1.5 GPa.

Figure 3:
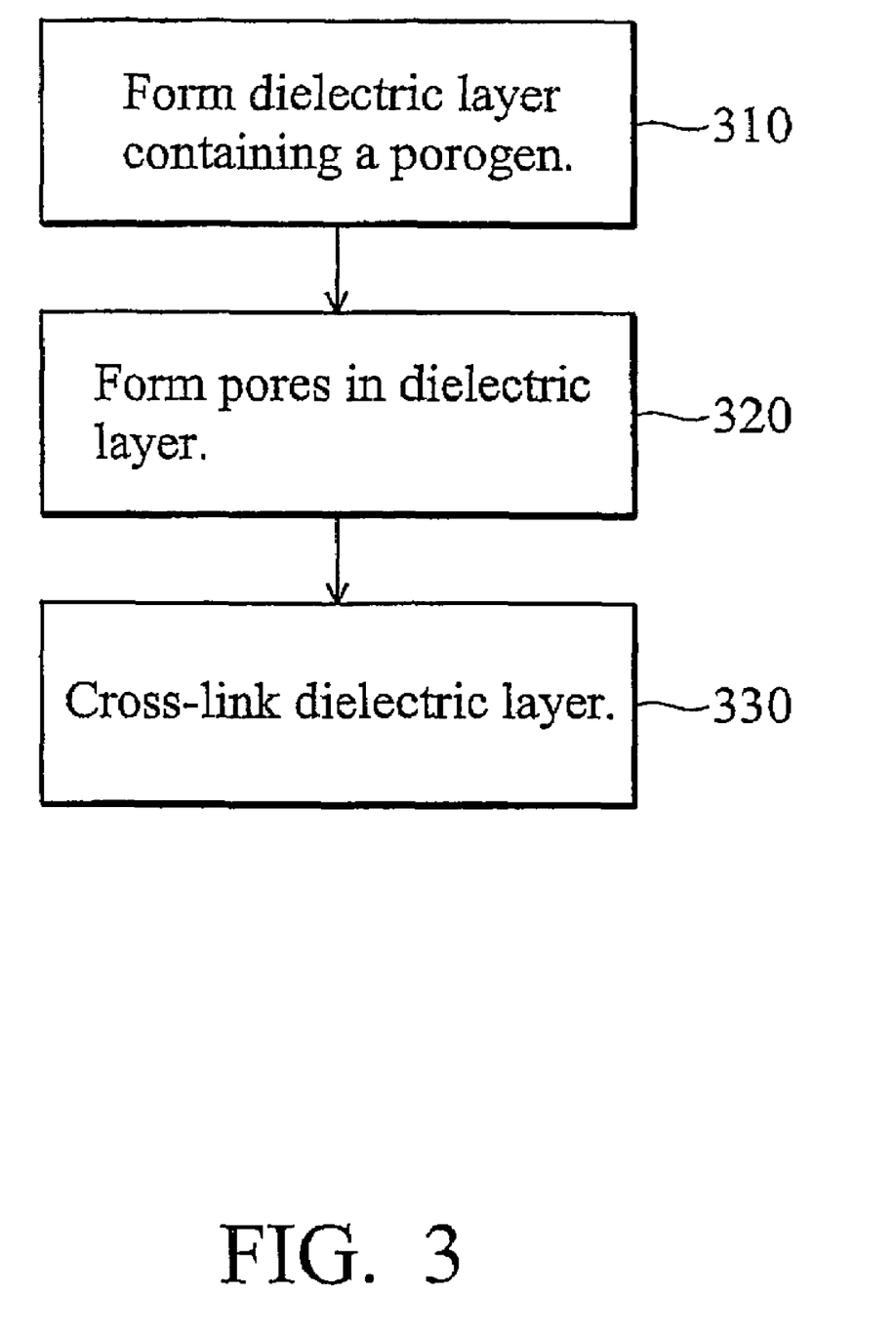
FIG. 3 is a process flow diagram of embodiments of the invention.

FIG. 3 illustrates the process steps described above. A first step 310 includes forming a dielectric layer containing a porogen on a substrate. Step 320 is a pore generation step. Step 320 comprises irradiating the dielectric layer with a first UV radiation in order to react the porogen. Step 330 is a dielectric cross-linking step. The dielectric cross-linking step 330 preferably follows the pore generation step 320. Step 330 comprises irradiating the dielectric layer with a second UV radiation. In addition to improving mechanical stability, the cross-linking step 330 repairs Si—H bonds, Si—OH (silanol) bonds, and dangling silicon bonds, which degrade dielectric performance. As such, the cross-linking step 330 may also be referred to as a dielectric-stabilizing step because its converts reactive Si—H bonds and Si—OH bonds to more stable Si—Si bonds.

One or more of the process steps summarized in FIG. 3 may occur in an environment that includes a gas. Suitable gases may include an inert gas such as Ar or He. Other gases may include $H_2$, $N_2$, $NH_3$, $CO_2$, a hydride gases or a mixture of these gases. In preferred embodiments, at least one of the UV radiation treatment steps (i.e., steps 320 and 330) further comprises a carbon-repairing gas ambient.

The carbon-repairing gas ambient increases the carbon content of the low-k dielectric layer. Such a treatment increases the resistance of the dielectric to processing damage during plasma etching or ashing steps. The carbon-repairing treatment may therefore also be referred to as a dielectric stabilizing treatment. Carbon repair gases comprises gases that contain carbon, preferably corresponding to the general formula $C_xH_y$, such as $C_2H_4$ or $C_3H_6$. Other preferred carbon repair gases include hexamethyldisilazane (HMDS) or supercritical $CO_2$. In embodiments of the invention, the carbon content of the dielectric may be raised from an initial value of about 14% to final value of about 23%.

Additionally, one or more of the irradiation steps of FIG. 3 may further comprise an e-beam and/or a thermal assist to control temperature and fully cure the dielectric. A preferred thermal assist comprises raising the temperature of one or more of the processing steps to at least about 225° C. An e-beam treatment preferably comprises a beam energy of about 20 to 150 mCoulomb/cm$^2$.

Figure 4A:
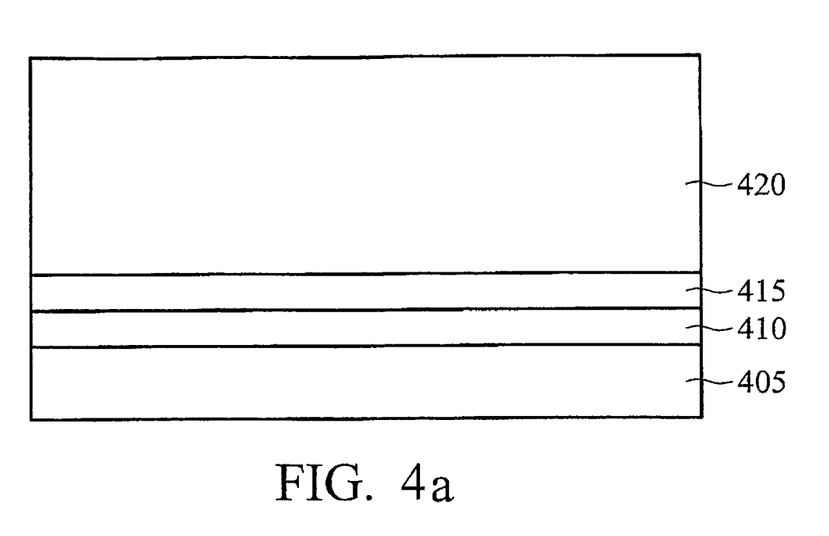
FIGS. 4a-4c are cross-sectional views showing a semiconductor interconnect structure according to an embodiment of the invention.
Figure 4B:
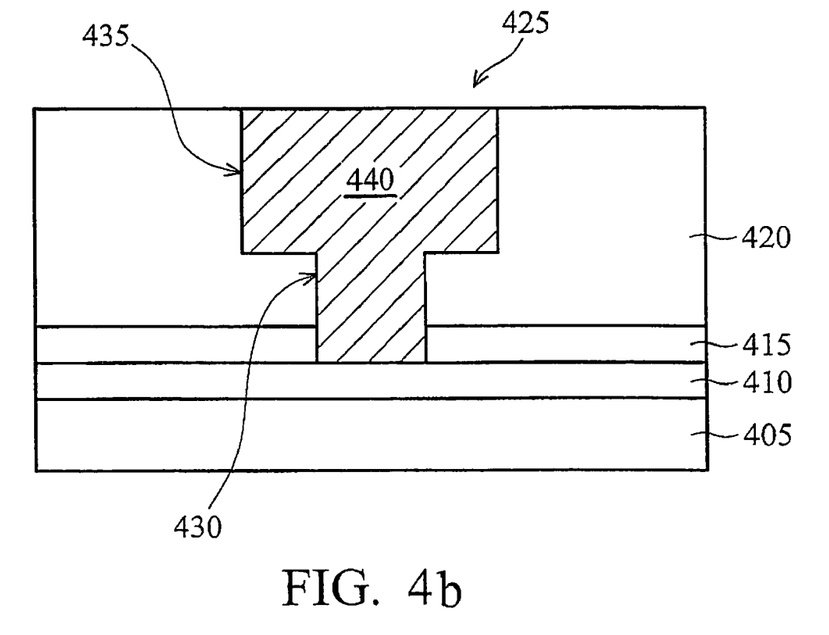
Figure 4C:
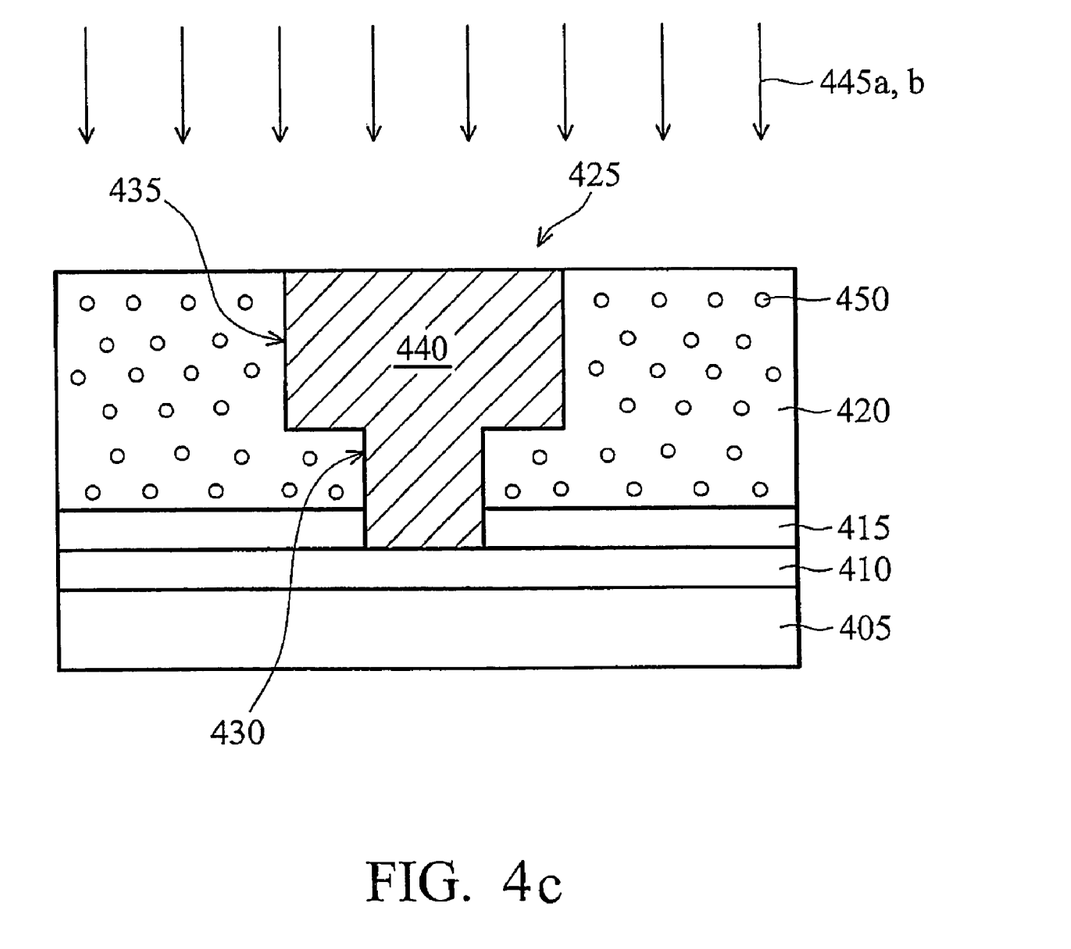

FIGS. 4a-4c illustrate cross-sections of a device that may be made according to embodiments of the invention. The present invention will now be described with respect to a preferred embodiment in a specific context, namely the creation of a low-k ILD and copper conductive lines in the damascene process. It is believed that embodiments of this invention are particularly advantageous in the damascene interconnect process since dielectric processing damage is known to hinder advanced interconnect integration. It is further believed that embodiments described herein will benefit other integrated circuit porogen applications not specifically mentioned. Therefore, this specific embodiment as well as others discussed are merely illustrative of specific ways to make and use the invention, and do not limit the scope of the invention.

Referring now FIG. 4a, there is shown a cross section of a representative intermediate semiconductor structure. The structure includes a substrate 405, a conductive layer 410 on the substrate 405, a barrier layer 415 on the conductive layer 410, and a porogen-containing dielectric layer 420 on the barrier layer 415.

The substrate 405 may comprise a silicon wafer, and the conductive layer 410 may comprise copper. The conductive layer 410 may also comprise a copper interconnect or yet another damascene structure. The porogen-containing dielectric layer 420, which may also be referred to as an inter-level dielectric (ILD) layer, preferably comprises a hydrogen silsesquioxane (HSQ) or a methylsilsesquioxane (MSQ) based dielectric. The barrier layer 415 is preferably about 10 to 30 Angstroms thick, and it may comprise TaN, TiN, WN, TbN, VN, ZrN, CrN, WC, WN, WCN, NbN, AlN, or combinations thereof. It may be applied using ALD, PVD, CVD, PECVD, PEALD.

Turning now to FIG. 4b, there is formed within intermediate semiconductor structure of FIG. 4a an anisotropically etched, dual damascene opening 425. The dual damascene opening 425 comprises a via portion 430 and an overlaying trench portion 435. While there are several ways to form a dual damascene structure, one approach involves at least two lithographic patterning and anisotropic etching steps to first form via openings 430 followed by a similar process to form overlying trench openings 435, which may encompass one or more via openings 430.

Still referring to FIG. 4b, a copper layer 440 is blanket deposited and planarized. The copper fills the dual damascene trench 435 and via opening 430. Although copper filling methods such as PVD and CVD may be used, electroplating is preferred because of its superior gap-filling and step coverage.

Turning now to FIG. 4c, the dielectric is cured according to the process flow summarized above and in FIG. 3. Specifically, the porogen containing dielectric 420 is cured by sequentially irradiating it in the following order with a first 445a and a second 445b wavelength of UV radiation. In accordance with preferred embodiments, the first wavelength is approximately 280 nm, the second wavelength is less than about 250 nm. One of the irradiating steps may further include treating the dielectric layer with a carbon-repairing gas such as HMDS.

The embodiments of the invention described above are exemplary and not limiting. Variations apparent to those skilled in the art that include the features of the invention are within the scope of the invention and the appended claims. Although embodiments of the present invention and their advantages have been described in detail, it should be understood that various changes, substitutions and alterations can be made herein without departing from the spirit and scope of the invention as defined by the appended claims.

For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a low-k dielectric layer, the method comprising:
   a first step comprising forming a layer on a substrate, wherein the layer comprises a pore generating material dispersed in an uncured matrix;
   a second step comprising forming pores in the uncured matrix by irradiating the layer with radiation having a first wavelength; and
   a third step comprising irradiating the layer with radiation having a second wavelength, wherein the first wavelength is larger than the second wavelength.

2. The method of claim 1, wherein the first wavelength is approximately 280 nm and the second wavelength is less than about 250 nm.

3. The method of claim 1, wherein forming the layer comprises a plasma enhanced chemical vapor deposition (PECVD) process.

4. The method of claim 1, wherein at least one of the steps further includes applying a gaseous ambient to form silicon-carbon bonds in the layer.

5. The method of claim 4, wherein the gaseous ambient comprises a material selected from the group consisting essentially $C_2H_4$, $C_3H_6$, hexamethyldisilazane (HMDS), supercritical $CO_2$, and combinations thereof.

6. The method of claim 4, wherein forming silicon-carbon bonds comprises converting a silanol bond to silicon-carbon bond.

7. The method of claim 1, wherein the uncured matrix comprises a material selected from the group consisting essentially of methyl silsesquioxane (MSQ), spun-on-glass (SOG), hydrogen silsesquioxane (HSQ), and combinations thereof.

8. The method of claim 1, wherein the pore generating material comprises a material selected from the group consisting essentially of an acrylic, a polynorbomene, and combinations thereof.

9. The method of claim 1, further comprising an e-beam treatment with a beam about 20 to 150 mCoulomb/cm$^2$.

10. A method of repairing processing damage in a carbon-containing, low-k, dielectric layer, the method comprising:
    forming a layer on a substrate, wherein the layer comprises a pore generating material dispersed in a matrix material;
    forming pores in the matrix material by irradiating the layer with radiation having a first wavelength;
    irradiating the layer with radiation having a second wavelength, wherein the second wavelength is less than the first wavelength; and
    annealing the layer in a carbon-containing ambient.

11. The method of claim 10, wherein the first wavelength is approximately 280 nm, and the second wavelength is less than about 250 nm.

12. The method of claim 10, wherein the carbon-containing ambient comprises a material corresponding to the general formula $C_xH_y$.

13. The method of claim 10, wherein the carbon-containing ambient comprises a material selected from the group consisting essentially of $C_2H_4$, $C_3H_6$, hexamethyldisilazane (HMDS), supercritical $CO_2$, and combinations thereof.

14. The method of claim 10, wherein annealing the layer in a carbon-containing ambient comprises converting a silanol bond to silicon-carbon bond.

15. The method of claim 10, wherein the matrix comprises a material selected from the group consisting essentially of methyl silsesquioxane (MSQ), spun-on-glass (SOG), hydrogen silsesquioxane (HSQ), and combinations thereof.

16. The method of claim 10, wherein the pore generating material comprises a material selected from the group consisting essentially of an acrylic, a polynorbomene, and combinations thereof.

17. A method of fabricating a damascene interconnect structure in a low-k dielectric, the method comprising:
    forming a low-k dielectric layer, wherein the low-k dielectric comprises a pore-generating material;
    fabricating a damascene interconnect structure in the low-k dielectric;
    irradiating the low-k dielectric and generating pores therein using a first UV wavelength radiation after fabricating the damascene interconnect structure; and
    irradiating the low-k dielectric and cross-linking it using a second UV wavelength radiation after generating pores, wherein the second wavelength is less than the first wavelength.

18. The method of claim 17, wherein the first wavelength is approximately 280 nm, and the second wavelength is less than about 250 nm.

19. The method of claim 17, further comprising annealing the low-k dielectric in carbon-containing ambient, where the ambient comprises a material selected from the group consisting essentially $C_2H_4$, $C_3H_6$, hexamethyldisilazane (HMDS), and combinations thereof.

* * * * *

UNITED STATES PATENT AND TRADEMARK OFFICE
CERTIFICATE OF CORRECTION

PATENT NO. : 7,482,265 B2  Page 1 of 1
APPLICATION NO. : 11/328596
DATED : January 27, 2009
INVENTOR(S) : Chen et al.

It is certified that error appears in the above-identified patent and that said Letters Patent is hereby corrected as shown below:

On the Title Page, Item (75), Inventors, 3rd entry, delete "Cheug" and insert --Jeng--.
In Col. 2, line 14, after irradiating insert --the--.
In Col. 4, line 54, delete "its" and insert --it--.
In Col. 5, line 2, delete "comprises" and insert --comprise--.
In Col. 5, line 31, after now insert --to--.
In Col. 6, line 58, after essentially insert --of--.
In Col. 7, line 3, delete "polynorbomene" and insert --polynorbornene--.
In Col. 8, line 7, delete "polynorbomene" and insert --polynorbornene--.
In Col. 8, line 28, after essentially insert --of--.

Signed and Sealed this

Twenty-eighth Day of April, 2009

JOHN DOLL
*Acting Director of the United States Patent and Trademark Office*